(12) United States Patent
Leccia et al.

(10) Patent No.: US 8,952,826 B2
(45) Date of Patent: Feb. 10, 2015

(54) CIRCUIT INTERRUPTER EMPLOYING A LINEAR TRANSDUCER TO MONITOR CONTACT EROSION

(71) Applicant: Eaton Corporation, Cleveland, OH (US)

(72) Inventors: Brad R. Leccia, Bethel Park, PA (US); Steven Castelein, Cumming, GA (US); Robert Yanniello, Asheville, NC (US); Johan De Jong, Hengelo (NL)

(73) Assignee: Eaton Corporation, Cleveland, OH (US)

( * ) Notice: Subject to any disclaimer, the term of this patent is extended or adjusted under 35 U.S.C. 154(b) by 266 days.

(21) Appl. No.: 13/644,176

(22) Filed: Oct. 3, 2012

(65) Prior Publication Data

US 2014/0090965 A1    Apr. 3, 2014

(51) Int. Cl.
    *H01H 33/664* (2006.01)
(52) U.S. Cl.
    USPC ........... 340/652; 340/635; 340/644; 307/116; 200/308; 218/123; 218/124; 324/424
(58) Field of Classification Search
    USPC ........... 340/644, 652, 635; 307/116; 200/308; 218/123, 124; 324/424
    See application file for complete search history.

(56) References Cited

U.S. PATENT DOCUMENTS

| 3,641,359 | A | * | 2/1972 | McCarty ............................. 361/2 |
| 5,747,984 | A | * | 5/1998 | Amft et al. .................... 324/71.2 |
| 6,965,089 | B2 | | 11/2005 | Stoving et al. |
| 7,239,490 | B2 | | 7/2007 | Benke |
| 7,253,630 | B1 | | 8/2007 | Zhou et al. |
| 7,332,906 | B2 | | 2/2008 | Marchand et al. |
| 7,915,766 | B2 | * | 3/2011 | Hernandez et al. ........... 307/137 |
| 2003/0071522 | A1 | * | 4/2003 | Baranowski et al. ......... 307/116 |
| 2009/0206059 | A1 | | 8/2009 | Kiko |

FOREIGN PATENT DOCUMENTS

| DE | 199 15 978 A1 | 10/2000 |
| DE | 102 29 096 A1 | 1/2004 |
| GB | 2 348 502 A | 10/2000 |
| WO | 01/01429 A2 | 1/2001 |

OTHER PUBLICATIONS

European Patent Office, "International Search Report and Written Opinion", Nov. 28, 2013, 10 pp.

* cited by examiner

*Primary Examiner* — Andrew Bee

(74) *Attorney, Agent, or Firm* — Eckert Seamans Cherin & Mellott, LLC; Philip E. Levy

(57) ABSTRACT

A circuit interrupter includes, a first contact and a second contact, the second contact being moveable relative to the first contact, a drive assembly structured to move the second contact relative to the first contact, and an erosion monitoring device including a linear transducer coupled to a portion of the drive assembly. The liner transducer is structured to generate an output signal representative of an amount of linear displacement of the portion of the drive assembly, wherein the erosion monitoring device is structured to monitor a degree of erosion of at least one of the first contact and the second contact based on the output signal.

8 Claims, 3 Drawing Sheets

CIRCUIT INTERRUPTER EMPLOYING A LINEAR TRANSDUCER TO MONITOR CONTACT EROSION

BACKGROUND

1. Field

The disclosed concept relates generally to circuit interrupters, and, in particular, to a circuit interrupter that employs a linear transducer, such as, without limitation, a linear variable differential transformer (LVDT), to monitor contact erosion.

2. Background Information

Circuit interrupters provide protection for electrical systems from electrical fault conditions such as, for example, current overloads, short circuits and abnormal level voltage conditions. Typically, circuit interrupters include a spring powered operating mechanism which opens electrical contacts to interrupt the current through the conductors of an electrical system in response to abnormal conditions, although a wide range of driving mechanisms may be employed.

Circuit interrupters, such as, for example, power circuit breakers for systems operating above about 1,000 volts, typically utilize vacuum interrupters (VIs) as the switching devices. Vacuum interrupters include separable main contacts disposed within an insulating housing. Generally, one of the contacts is fixed relative to both the housing and to an external electrical conductor which is interconnected with the power circuit associated with the circuit interrupter. The other contact is moveable. In the case of a vacuum interrupter, the moveable contact assembly usually comprises a stem of circular cross-section having the contact at one end enclosed within a vacuum chamber and a driving mechanism coupled at the other end which is external to the vacuum chamber. An operating rod assembly comprising a push rod, which is fastened to the end of the stem opposite the moveable contact, and a driving mechanism provide the motive force to move the moveable contact into or out of engagement with the fixed contact.

VIs are typically used, for instance, to reliably interrupt medium voltage alternating current (AC) currents and, also, high voltage AC currents of several thousands of amperes or more. Typically, one VI is provided for each phase of a multiphase circuit and the VIs for the several phases are actuated simultaneously by a common operating mechanism, or separately by separate operating mechanisms (and separate auxiliary switches).

Over the life of a VI, the surface of each of the contacts will slowly erode due to the arcing that occurs between the contacts during each interruption. Typically, each contact will lose 1-1.5 mm of material over its life due to erosion. This loss of material is taken up by the contact spring, causing it to lose 2-3 mm of its compression. This loss of compression translates to a loss of compressive force on the contacts within the VI. Sufficient contact force is very important to the performance of VIs. In particular, insufficient contact force increases the risk of overheating or explosion in the event of a short circuit. Thus, it is important to monitor the amount of contact erosion over the life of a VI in order to monitor the extent to which contact force is decreasing. Such monitoring, however, is difficult or even impossible in current designs where visual access to the contacts is limited or nonexistent (e.g., designs where the contacts are hidden).

There is thus a need for a mechanism for monitoring the amount of contact erosion over the life of a VI that will be operable even in designs where visual access to the contacts is limited or nonexistent.

SUMMARY

These needs and others are met by embodiments of the disclosed concept, which are directed to circuit interrupter and associated method having a mechanism for monitoring the amount of contact erosion over the life thereof.

In one embodiment, a circuit interrupter is provided that includes, a first contact and a second contact, the second contact being moveable relative to the first contact, a drive assembly structured to move the second contact relative to the first contact, and an erosion monitoring device including a linear transducer coupled to a portion of the drive assembly. The liner transducer is structured to generate an output signal representative of an amount of linear displacement of the portion of the drive assembly, wherein the erosion monitoring device is structured to monitor a degree of erosion of at least one of the first contact and the second contact based on the output signal.

In another embodiment, a method of monitoring a degree of erosion of at least one of a first contact and a second contact of a circuit interrupter having a drive assembly structured to move the second contact relative to the first contact is provided. The method includes measuring an amount of linear displacement of a portion of the drive assembly responsive to the circuit interrupter moving from a closed condition in which the first contact engages the second contact to an open condition in which the first contact does not engage the second contact, and determining that the degree of erosion has at least reached a predetermined level based on the measured amount of linear displacement.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
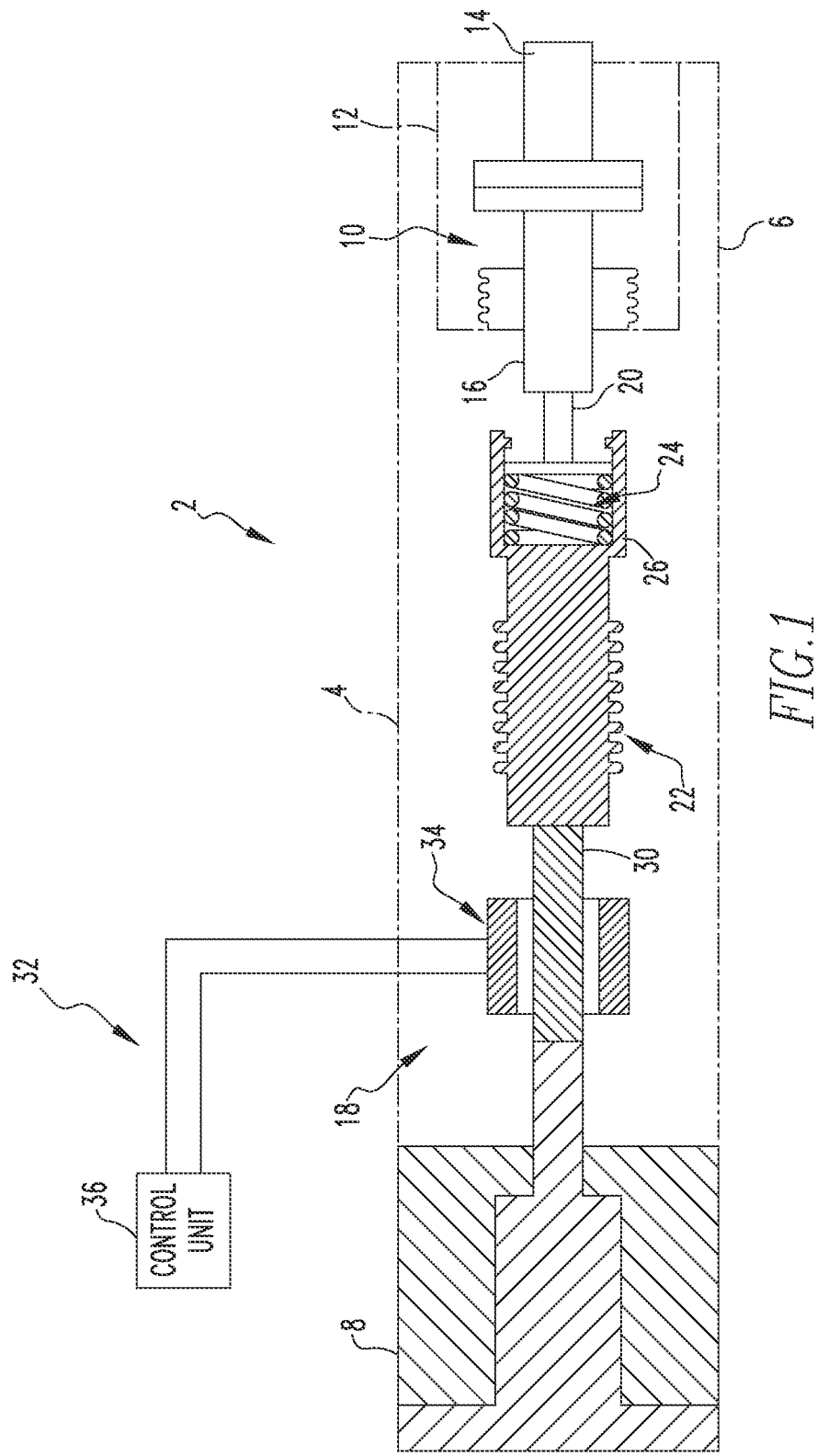
FIGS. 1 and 2 are schematic diagrams of a circuit interrupter according to an exemplary embodiment of the present invention.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

Figure 2:
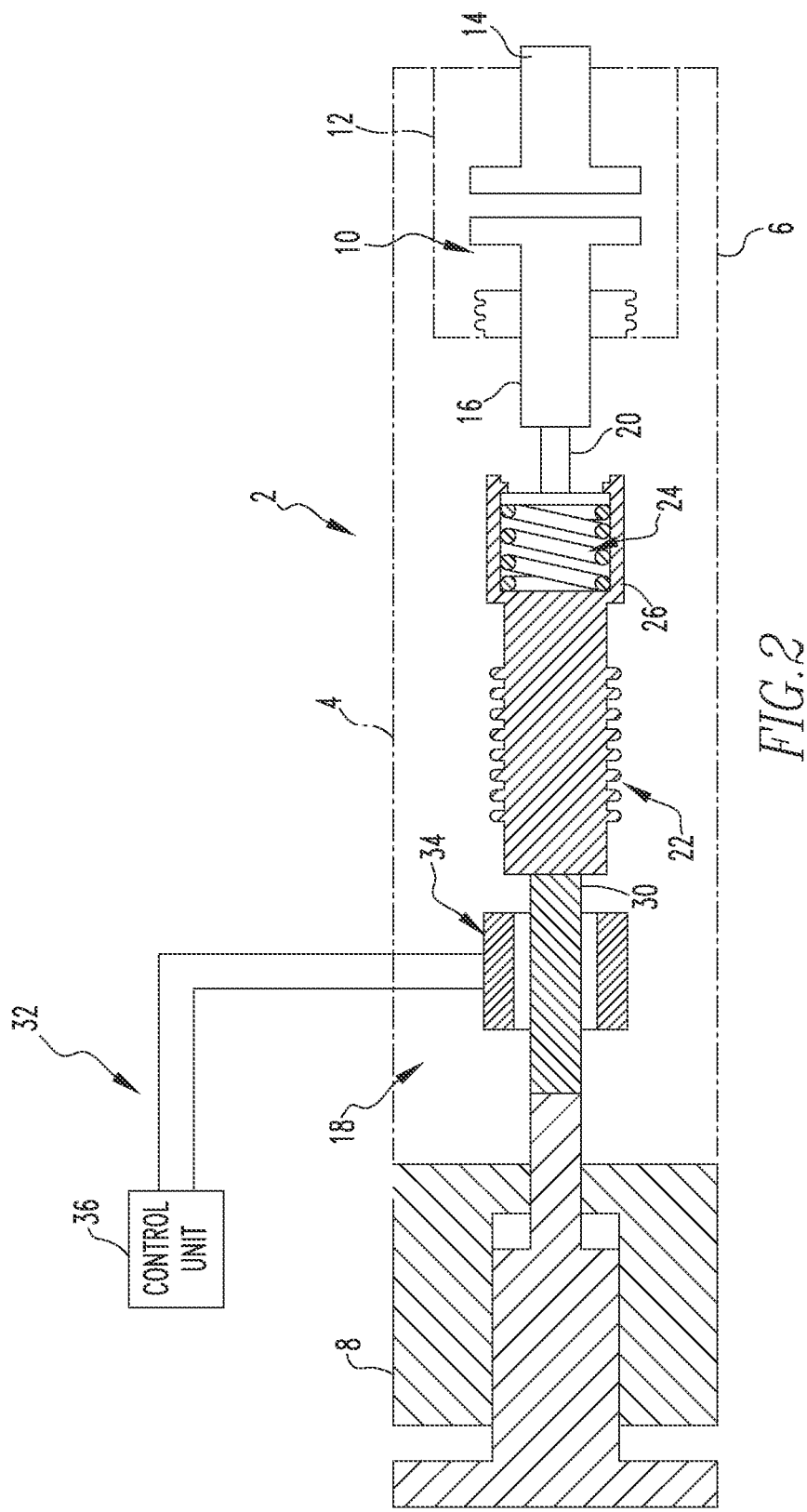

FIGS. 1 and 2 are schematic diagrams of a circuit interrupter 2 according to an exemplary embodiment of the present invention. In FIG. 1, circuit interrupter 2 is shown in a closed condition and in FIG. 2 circuit interrupter is shown in an open condition. Circuit interrupter 2 includes a main housing 4 having a first end 6 and a second, opposite end 8. As seen in FIGS. 1 and 2, a vacuum interrupter 10 is provided at first end 6. Vacuum interrupter 10 includes a vacuum chamber 12 which houses fixed contact 14 and movable contact 16.

Circuit interrupter 2 further includes a drive assembly 18 provided within main housing 4. Drive assembly 18 is structured to drive movable contact 16 so as to enable selective opening (FIG. 2) and closing (FIG. 1) of vacuum interrupter 10. Drive assembly 18 includes a push rod 20, a drive rod 22, a spring 24 held within a housing 26 provided at the first end of drive rod 22, and a magnetic actuator 28 provided at the second end 8 of housing 4 and coupled to a rod member 30 provided at the second end of drive rod 22. Push rod 20 has a first end coupled to movable contact 16 and a second end coupled to spring 24.

In addition, circuit interrupter 2 also includes an erosion monitoring device 32 that is coupled to drive assembly 18. Erosion monitoring device 32 is structured to measure/monitor the degree to which fixed contact 14 and movable contact 16 have eroded during the life of circuit interrupter 2 in the manner described in detail herein.

Erosion monitoring device 32 includes a linear transducer that is coupled to rod member 30 for measuring the linear position of rod member 30. In the exemplary, illustrated embodiment, the linear transducer is in the form of an LVDT 34. It will be understood, however, that other types of linear transducers, such as, without limitation, linear encoders and digital spring probes and linear and string potentiometers, may also be used. Erosion monitoring device 32 also includes a control unit 36 that receives signals from LVDT 34. Control unit 36 includes a processing portion which may be, for example, a microprocessor, a microcontroller or some other suitable processing device, and a memory portion that may internal to the processing portion or operatively coupled to the processing portion and that provides a storage medium for data and software executable by the processing portion for controlling the operation of erosion monitoring device 32 as described herein.

Figure 3:
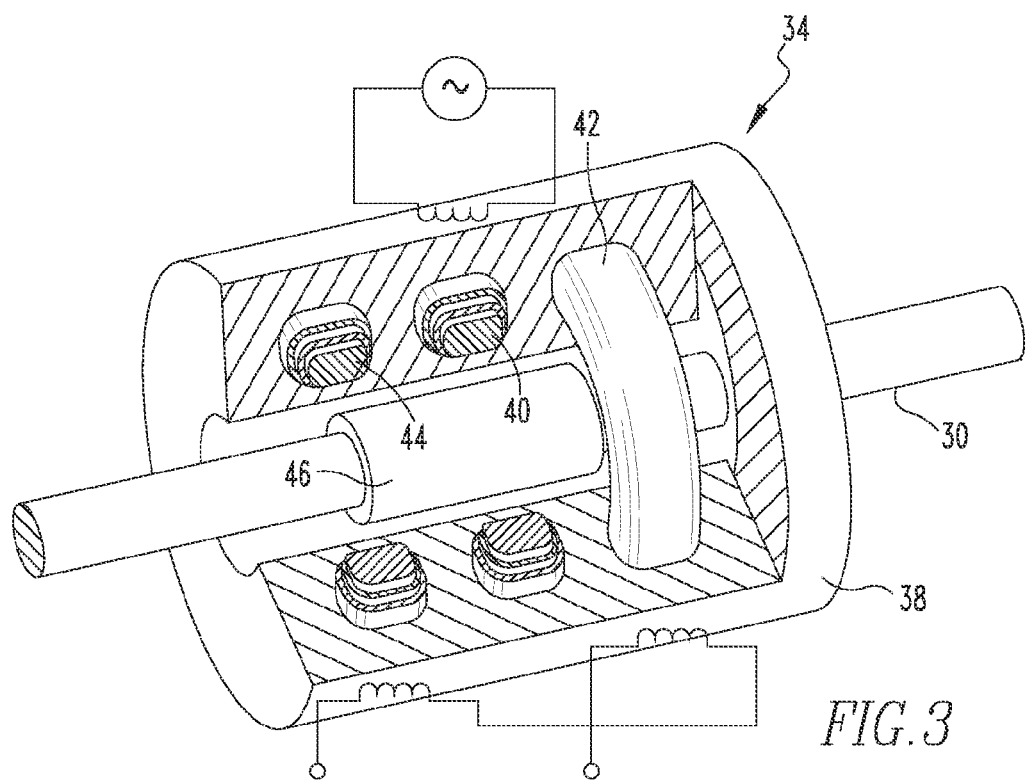
FIG. 3 is a schematic diagram of an LVDT forming part of the circuit interrupter of FIGS. 1 and 2 according to an exemplary embodiment.

LVDT 34 according to the exemplary embodiment is shown in schematic form in FIG. 3 coupled to rod member 30. As is known in the art, LVDT 34 is an electrical transducer used for measuring linear displacement. As seen in FIG. 3, LVDT 34 includes three solenoidal coils placed end-to-end in a housing 38. The coils include a center primary coil 40, a first outer secondary coil 42 and a second outer secondary coil 44. The coils 40, 42 and 44 are wrapped around a cylindrical ferromagnetic core 46, which in turn is coupled to the object whose movement or displacement is being measured, i.e., rod member 30. As seen in FIG. 3, both ferromagnetic core 46 and rod member 30 are provided within housing 38 in a manner wherein they are able to slide along the longitudinal axis of housing 38.

In operation, an alternating current is driven through primary coil 40, causing a voltage to be induced in each secondary coil 42, 44 proportional to its mutual inductance with primary coil 40. The frequency is usually in the range 1 to 10 kHz. As ferromagnetic core 46 moves, these mutual inductances change, causing the voltages induced in secondary coil 42, 44 to change. The coils are connected in reverse series, so that the output voltage is the difference (hence "differential") between the two secondary voltages of the secondary coils 42, 44. When ferromagnetic core 46 is in its central position equidistant between the two secondary coils 42, 44, equal but opposite voltages are induced in these two secondary coils 42, 44, so the output voltage is theoretically zero. In practice, minor variations in the way in which primary coil 40 is coupled to each secondary coil 42, 44 means that a small voltage is actually output when ferromagnetic core 46 is central. When ferromagnetic core 46 is displaced in one direction, the voltage in one of the secondary coils 42, 44 increases as the voltage in the other of the secondary coils 42, 44 decreases, thereby causing the output voltage of LVDT 34 to increase from zero to a maximum value. This voltage is in phase with the voltage of primary coil 40. When ferromagnetic core 46 moves in the other direction, the output voltage also increases from zero to a maximum value, but its phase is opposite to that of primary coil 40. The magnitude of the output voltage of LVDT 34 is proportional to the distance moved by ferromagnetic core 46 (up to its limit of travel), which is why the device is described as having a "linear" response to displacement. The phase of the voltage indicates the direction of the displacement.

Because the sliding ferromagnetic core 46 does not touch the inside of housing 38, it can move without friction, making LVDT 34 a highly reliable device. The absence of any sliding or rotating contacts allows LVDT 34 to be completely sealed against the environment.

Figure 4:
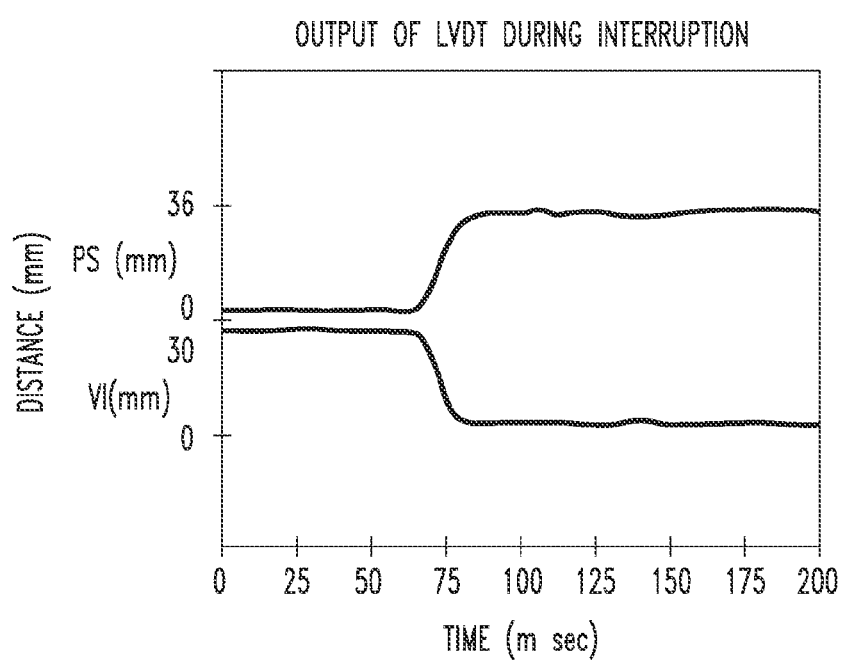
FIG. 4 is a plot of a typical output of the LVDT of FIGS. 1-3 during an interruption.

During operation of circuit interrupter 2, the output voltage of LVDT 34 (proportional the distance travelled by rod member 30) is provided to control unit 36. As a result, during each interruption wherein circuit interrupter 2 is opened, the distance travelled by rod member 30 and the time of such travel can be determined by control unit 36 based on the output voltage of LVDT 34 (such distance and time can be plotted as shown in FIG. 4). As will be appreciated, this data may also be translated to velocity (slope of the distance v. time curve) and acceleration (are under the distance v. time curve) of rod member 30 (and thus of drive assembly 18).

This velocity and acceleration data can then be used to monitor the current extent of erosion of fixed contact 14 and moveable contact 16. In particular, as noted above, the amount of compression of spring 24 when circuit interrupter 2 is closed will decrease as the amount of erosion of fixed contact 14 and moveable contact 16 increases. As the compression of spring 24 decreases, the energy stored in spring 24 will when circuit interrupter 2 is closed decrease, which in turn will cause the velocity and acceleration of rod member 30 during an interruption (i.e., during opening) to decrease as erosion increases. Thus, control unit 36 can be programmed to monitor velocity and/or acceleration of rod member 30 over the life of circuit interrupter 2 and determine that erosion of fixed contact 14 and moveable contact 16 has reached or exceeded a predetermined level wherein performance of circuit interrupter 2 may suffer when velocity and/or acceleration fall below some predetermined level. As will be appreciated, the particular predetermined level will depend on various factors, such as the construction and characteristics of spring 24 and/or fixed contact 14 and moveable contact 16. In addition, in one embodiment, control unit may be programmed to, responsive to determining that the degree of erosion has at least reached the predetermined level discussed above, generate some sort of output (e.g., a visual output on a display or audible output via speaker) indicating that this has happened so that corrective action can be taken.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter, comprising:
- a first contact and a second contact, the second contact being moveable relative to the first contact;
- a drive assembly structured to move the second contact relative to the first contact, the drive assembly including: (i) a magnetic actuator, (ii) a rod member coupled to the magnetic actuator, (iii) a cylindrical ferromagnetic core coupled to the rod member, (iv) a drive rod coupled to a distal end of the rod member, the drive rod having a housing at a distal end thereof, the housing holding a spring, and (v) a push rod provided partially within the housing in engagement with the spring, wherein a distal end of the push rod is coupled to the second contact, and wherein an energy of the spring and the magnetic actuator together are structured to open the circuit interrupter by moving the second contact away from the first contact; and
- an erosion monitoring device including a linear transducer and a control unit coupled to the linear transducer, the liner transducer being structured to generate an output signal representative of an energy of the spring used to move the second contact away from the first contact based on an amount of linear displacement of the cylindrical ferromagnetic core, wherein the control unit is structured to determine a velocity or an acceleration of the cylindrical ferromagnetic core based on the output signal responsive to the circuit interrupter moving from a closed condition in which the first contact engages the second contact to an open condition in which the first contact does not engage the second contact and monitor a degree of erosion of at least one of the first contact and the second contact based on the velocity or the acceleration.

2. The circuit interrupter according to claim 1, wherein the first contact and the second contact are provided as part of a vacuum interrupter within a vacuum chamber.

3. The circuit interrupter according to claim 2, wherein at least the vacuum interrupter and the drive assembly are provided within a main housing, and wherein the first contact is fixed relative to the main housing.

4. The circuit interrupter according to claim 1, wherein the linear transducer is a linear variable differential transformer (LVDT).

5. A method of monitoring a degree of erosion of at least one of a first contact and a second contact of a circuit interrupter having a drive assembly structured to move the second contact relative to the first contact, the drive assembly including: (i) a magnetic actuator, (ii) a rod member coupled to the magnetic actuator, (iii) a cylindrical ferromagnetic core coupled to the rod member, (iv) a drive rod coupled to a distal end of the rod member, the drive rod having a housing at a distal end thereof, the housing holding a spring, and (v) a push rod provided partially within the housing in engagement with the spring, wherein a distal end of the push rod is coupled to the second contact, and wherein an energy of the spring and the magnetic actuator together are structured to open the circuit interrupter by moving the second contact away from the first contact, the method comprising:
- measuring with a linear transducer an energy of the spring used to move the second contact away from the first contact based on an amount of linear displacement of the cylindrical ferromagnetic core responsive to the circuit interrupter moving from a closed condition in which the first contact engages the second contact to an open condition in which the first contact does not engage the second contact;
- generating an output signal representative of the energy of the spring and the amount of linear displacement;
- determining a velocity or an acceleration of the cylindrical ferromagnetic core based on the output signal;
- monitoring a degree of erosion of at least one of the first contact and the second contact based on the velocity or the acceleration; and
- determining that the degree of erosion has at least reached a predetermined level based on the monitoring.

6. The method according to claim 5, wherein the first contact and the second contact are provided as part of a vacuum interrupter within a vacuum chamber.

7. The method according to claim 6, wherein at least the vacuum interrupter and the drive assembly are provided within a main housing, and wherein the first contact is fixed relative to the main housing.

8. The method according to claim 5, wherein the linear transducer is a linear variable differential transformer (LVDT).

* * * * *